United States Patent [19]

Müller et al.

[11] Patent Number: 4,780,676
[45] Date of Patent: Oct. 25, 1988

[54] METHOD AND DEVICE FOR COOLING A RESISTIVE MAGNET SYSTEM FOR NUCLEAR SPIN TOMOGRAPHS

[76] Inventors: Wolfgang Müller, Köslinerstrasse 48a, D-7500 Karlsruhe 1; Klaus Goebel, Hebelstrasse 1, D-7512 Rheinstetten 3, both of Fed. Rep. of Germany

[21] Appl. No.: 40,885

[22] Filed: Apr. 21, 1987

[30] Foreign Application Priority Data

Apr. 23, 1986 [DE] Fed. Rep. of Germany ....... 3613682

[51] Int. Cl.⁴ .......................................... G01R 33/20
[52] U.S. Cl. ................................... 324/318; 324/300; 165/12; 165/64
[58] Field of Search ............... 324/300, 307, 316, 318, 324/319, 320, 321; 335/299, 300; 165/12, 26, 61, 64

[56] References Cited

U.S. PATENT DOCUMENTS

| 4,276,529 | 6/1981 | Heinzerling et al. | 335/300 |
| 4,660,013 | 4/1987 | Laskaris et al. | 324/318 |
| 4,672,346 | 6/1987 | Miyamoto et al. | 335/300 |

FOREIGN PATENT DOCUMENTS

| 1049007 | 9/1955 | Fed. Rep. of Germany . | |
| 3404457 | 2/1984 | Fed. Rep. of Germany . | |
| 1346087 | 1/1963 | France . | |
| 0097806 | 5/1986 | Japan | 324/300 |

*Primary Examiner*—Michael J. Tokar
*Assistant Examiner*—Kevin D. O'Shea
*Attorney, Agent, or Firm*—Kokjer, Kircher, Bradley, Wharton, Bowman & Johnson

[57] ABSTRACT

A method and a device serve for cooling a magnet system, in particular a magnet system (50) of a nuclear spin tomograph, with high homogeneity of the magnetic field. A coil (51, 52, 53, 54) made from an electrically conductive material having a finite active resistance is connected to a power supply unit (72). A cooling body being in thermally conductive contact with the coil (51, 52, 53, 54) is passed by a cooling agent. In a first operating mode, at rated duty, the coil (51, 52, 53, 54) is supplied with a rated current, and the active throughput of the cooling agent is adjusted to a rated value. In order to keep the energy costs low during inoperative times of the magnet system, while keeping the waiting trimes required when the magnet system is switched on again as low as possible, a second operating mode, defined as stand-by duty, is provided during which the coil (51, 52, 53, 54) is supplied with a rest current and the active throughput of the cooling agent is adjusted to a rest value.

10 Claims, 3 Drawing Sheets

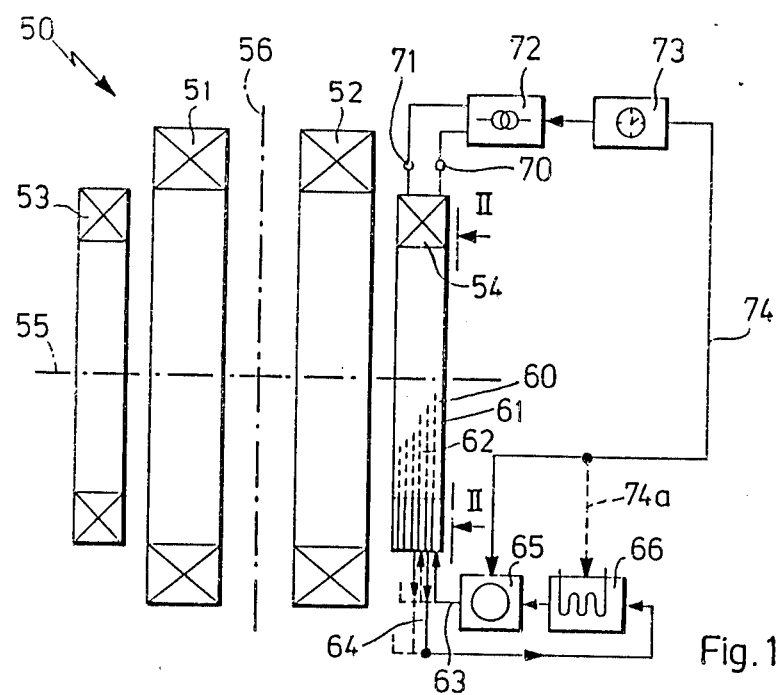
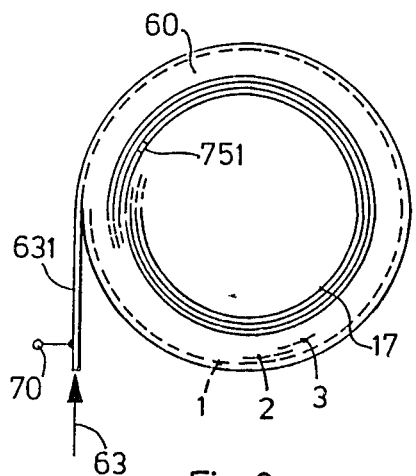
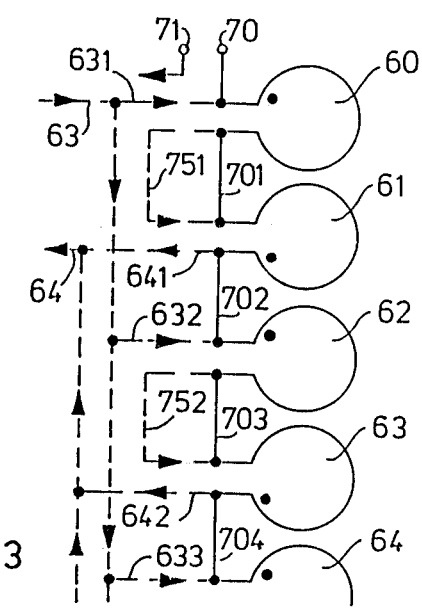
Fig. 1
Fig. 2
Fig. 3

METHOD AND DEVICE FOR COOLING A RESISTIVE MAGNET SYSTEM FOR NUCLEAR SPIN TOMOGRAPHS

The present invention relates to a method for cooling a magnet system, in particular a magnet system of a nuclear spin tomograph with a magnetic field of high homogenerity, in which at least one coil made from an electrically conductive material of finite active resistance is connected to a power supply unit and a cooling body, which is in thermally conductive contact with the coil, is passed bu a cooling agent and in which, in a first operating mode, at rated duty, the coil is supplied by the power supply unit with a rated current and the effective throughput of the cooling agent is adjusted to a rated value.

The present invention further relates to a device for carrying out this method.

There are different measuring procedures in the field of physics and medicine which require a magnetic field of relatively high strength, for example in the range of $B=0.1$ to 3 Tesla, and high homogeneity of, for example, $\Delta B/B = 10^{-5}$ to be generated in a relatively large volume of, for example, $30 \times 30 \times 50$ cm. A typical example of such an application is found in nuclear spin tomography where a human body is exposed to the before-mentioned ccnstant magnetic field and to one or more high-frequency fields for the purpose of generating two-dimensional cross-sectional images of the human body.

It has been known heretofore to use normally conductive or superconductive magnet systems for this purpose.

Usually, the normally conductive magnet systems used consist of air-cored coil systems in Helmholtz arrangement or of iron magnets, in which case the before-mentioned magnetic fields are generated by supplying the coils of the magnet system with current from a power supply unit which has to supply an output in the range of some 10 kW.

It will be easily seen that given this electric power the coils are heated up considerably. Consequently, the coils are wound from metallic hollow sections of high electric conductivity, the hollow section being passed by a cooling agent, for example demineralized water. The cooling agent is fed through the hollow section by means of a suitable pump, preferably in a closed circuit comprising also a heat exchanger. This direct cooling system enables the Joule's heat generated in the coils by the energizing current to be carried off.

From the book by Montgomery entitled "Solenoid Magnet Design", Wiley-Interscience, 1969, pages 55 to 57, it has been known also to build up coils from the hollow sections by winding the latter in the form of a flat spiral so that a disc-like coil element is obtained. The supply line and the electric connection are provided in this case on the outer periphery of the first disc, the transition to the plane of the second disc is effected in the interior without any connection, and the outlet line and the second electric connection are provided on the outer periphery of the second disc. A complete excitation coil is built up from a given number of such double spirals, and several such disc-like coils can be arranged side by side to form one coil of the magnet system. Electrically, these flat coils are connected in series so that the energizing current flows through the coils in succession. As regards the flow of the cooling agent, the individual flat coils are connected in series in opposite senses so as to form pairs which pairs are then connected in parallel. The cooling agent arriving from a common supply line, therefore, enters every second flat coil, for example at its outer periphery, flows through the latter, is transferred at its inner end to the neighbouring flat coil, and then returned from there through a common outlet line. During operation at rated current, one obtains within each double spiral a temperature profile which is determined by the energy balance and the heat transmission within the coil. It is to be noted, however, that the temperatures encountered within the coil may be significantly higher than the outlet temperature of the cooling agent.

The before-described known magnet systems are, however, connected with two conflicting problems.

The very high supply powers required for operating the magnet systems give rise to considerable energy costs if the known magnet systems are operated continuously at their rated values.

If, one the other hand, with a view to saving energy costs, the magnet systems are switched off outside the normal operating hours, in particular over night, the magnet systems will of course cool down over night so that they have to be heated up again when switched on in the morning of the next working day.

In order to obtain the operating conditions described at the outset, in particular the necessary extremely high homogeneity of the magnetic field, a cold magnet system must be permitted to heat up over several hours at rated duty before field values of convenient long-term stability are reached.

Now, it is the object of the present invention to improve a method of the before-described type in such a manner that its energy costs are notably reduced compared with the continuous operation at rated duty while on the other hand no or only short waiting times have to be observed when switching on the magnet system after it had been switched off.

According to the method described at the outset, this object is achieved by the fact that in a second operating mode, at stand-by duty, the coil is supplied by the power supply unit with a rest current and the active throughput of cooling agent is adjusted to a rest value.

According to the device mentioned at the outset, this object is achieved by the fact that the power supply unit and the cooling agent supply units are actively connected to a timing device whose control signals influence the output current of the power supply unit and the active throughput of the cooling agent supply units.

This solves the object underlying the present invention fully and perfectly because the operating temperature of the magnet system can be kept substantially constant by reducing the energizing current and, at the same time, the cooling performance of the cooling system so that whilst the thermal equilibrium is re-established, the energy supply and energy discharge are notably reduced.

This permits considerable savings in energy costs because relatively little electric power is required for maintaining the operating temperature of the magnet system if at the same time the efficiency of the cooling system is reduced correspondingly. In the extreme, the cooling system may even be switched off completely and the magnet system can be kept at operating temperature with a very low rest current.

According to a preferred embodiment, however, both the energizing current and the performance of the cooling system are set to a finite rest value as this leads to conditions regarding the distribution of heat in the magnet system which correspond to the real conditions prevailing during operation at rated duty.

For, when the magnet system is operated at rated current and the active throughput of cooling agent is kept at the rated value, a temperature drop is of course encountered along the path of the cooling agent because the cooling agent naturally is heated up on its way through the energizing coil so that its cooling effect decreases gradually on its way through the coil. Now, if the active throughput of cooling agent were reduced to zero, a given rest temperature would build up in the magnet system macroscopically, but microscopically the temperature distribution within the magnet system would differ from that prevailing during operation at rated duty so that in order to obtain this temperature distribution a certain start-up time would again have to be observed when raising the energizing current and the active throughput of cooling agent to their rated values.

According to other embodiments of the invention, the active throughput of cooling agent is adjusted either by varying the cooling-agent temperature and/or by varying the flow rate (per unit of time) of the cooling agent.

This may be achieved in certain embodiments of the device according to the invention by adjusting either the speed of a cooling agent pump or a setting valve in a cooling-agent pressure line, or by adjusting the efficiency of a heat exchanger, for example by varying the throughput of the primary cooling agent, by varying the speed of a cooling blower of an air-type heat exchanger, or the like.

According to a particularly preferred embodiment of the method of the invention, the rated values are set during the day, and the rest values are set during the night of a working day.

This measure provides the advantage that the low-cost inoperative condition of the magnetic system can be maintained during the whole night while in the morning of the working day the operation can be switched over to rated duty without any, or at least without any notable, waiting times, provided the procedural parameters have been properly selected. However, it is of course also possible to switch over between rated duty and the inoperative condition during breaks, for example at lunch, or the like.

Another preferred embodiment of the method according to the invention distinguishes itself by the fact that the transition between the rest values and the rated values follows a steadily rising or stepped curve.

This measure provides the advantage that, starting from the inoperative condition, the rated values can be reached even more efficiently, it being even possible, by means of a suitable timing clock, to increase the energizing current and the active cooling agent throughput continuously from the rest values to the rated values, already some time before the beginning of the working time.

Finally, the method according to the invention is particularly preferred in connection with the known magnet systems described at the outset using coils wound from hollow sections in the form of pairs of flat spirals which are then connected in the described manner, electrically and as regards the cooling-agent lines.

For, it is the particular advantage of this type of magnet system that very clear temperature gradients are obtained at rated duty across the length of the hollow sections because the cooling agent is heated up significantly as it passes the relatively long way through the hollow sections. This means that, typically, the temperature encountered at the inner circumferential surface of the flat coils will rise by, say, 10° to 15° every time the cooling agent is fed in from the outer periphery of the flat spirals, and this temperature gradient affects of course the homogeneity of the magnetic field, all elements of the magnetic system having a finite thermal expansion coefficient. Any change of the temperature distribution existing during rated operation would then cause different areas of the coil to expand or contract so that considerable changes in the homogeneity of the magnetic field would be encountered even if the average temperature remained constant. By reducing the active throughput of the ccoling agent purposefully to a finite value, while reducing at the same time also the energizing current, this effect would be absolutely avoided because, fundamentally, the heat development over the length of the hollow sections would remain unchanged.

Finally, a good effect can be achieved by connecting the timing clock of the magnet system in a first operating mode to a power supply unit and a cooling-agent supply unit of high capacity (rated power), and in the second operating mode to units of lower capacity (lower power).

This arrangement provides the advantage that the units used in both operating modes can be selected in such a manner that their—substantially constant—ratings are optimally adapted to provide the best possible efficiency.

Other advantages of the invention will become apparent from the following description and the attached drawing.

It goes without saying that the advantages which have been described above and which will be mentioned hereafter, may be used not only in the described combination, but also in any other combination or individually without leaving the scope of the present invention.

One embodiment of the invention will be described hereafter with reference to the drawing in which:

FIG. 1 shows a very schematic block diagram of a magnet system of the type suited for use in connection with the method according to the invention,;

FIG. 2 shows a side view, in the direction indicated by arrows II—II in FIG. 1;

FIG. 3 shows a wiring diagram illustrating the electric connection and the connection of the cooling-agent lines of the magnet system shown in FIGS. 1 and 2;

Figure 4:
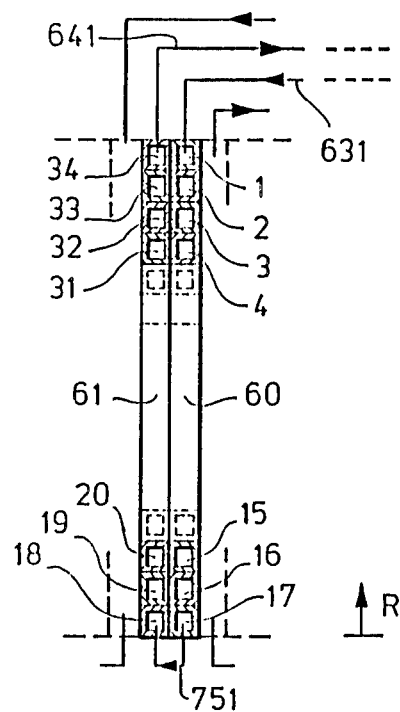
FIG. 4 is a diagrammatic representation, in greatly enlarged scale, of a pair of flat coils arranged side by side in a magnet system according to FIGS. 1 and 2.

In FIG. 1, reference numeral 50 designates generally a magnet system designed as a double Helmholtz system comprising two symmetrical paris of coils 51, 52; 53, 54 arranged symmetrically relative to a longitudinal axis 55 and a vertical axis 56.

As indicated in coil 54, the latter—just as the other coils 51 to 53—is made up of several discs 60, 61, 62 arranged one on top of the other in the direction of the longitudinal axis 55. Every second of the discs 60, 61, 62 is connected to a cooling-agent supply 163, while the other discs are connected to a cooling-agent outlet 164 so that components in the form of double spirals are obtained.

The cooling-agent supply 163 and the cooling-agent outlet 164 are part of a closed cooling-agent circuit which comprises in addition a cooling-agent pump 65 and a heat exchanger 66.

The coil 54, just as the other coils 51 to 53, is provided with terminals 70, 71 connected to a power supply unit 72.

The system according to the invention comprises further a timing unit 73 which generates control signals as a function of time and supplies them to the power supply unit 72 and, via a control line 74, to the cooling-agent pump 65 and/or to the heat exchanger 66, via a control line 74a.

As can be seen very clearly in FIG. 2, the disc 60 is formed by a spiral wound from an electric conductor, for example a hollow copper seotion, with windings 1, 2, 3 ... 17 extending in spiral form from the outside to the inside. At the inner circumference of the disc 60 a connection 751 can be seen which leads to the corresponding inner end of the neighbouring disc 61. At the outer periphery of the disc 60, the hollow copper section is guided outwardly by a stub line 631 which is connected to the cooling agent supply 163 and also to the terminal 70.

The electric connection and the connection of the coolingagent lines of the individual spirals of the discs 60, 61, 62, 63, 64 ... are shown diagrammatically in FIG. 3.

As regards the electric connection it is easily seen that the spirals of the discs 60, 61, 62 ... are connected in series. This is achieved by connection lines 701, 702, 703, 704 forming together with the lines of the spirals a closed current path, from terminal 70 to the terminal 71.

As regards the connection of the cooling-agent lines, the hollow sections of two neighbouring discs 60, 61 or 62, 63 or 64 ... are connected in series in opposite senses which is achieved by the before-mentioned connection 751 and the corresponding connections 752 ... Consequently, each of the discs 60/61 and 62/63, etc. forms a double spiral. These oppositely directed series-connections 60/61, 62/63 ... are connected to the cooling-agent supply 163 via stub lines 631, 632 ... and, by their opposite ends, to the cooling-agent outlet 164 via stub lines 641, 642 ...

This means in summary that the energizing current flows through the series-connected flat spirals of the discs 60, 61, 62 ... in succession, while the cooling agent flows in parallel through a number of individual cooling circuits corresponding to half the number of the discs 60, 61, 62 ....

FIG. 4 illustrates the conditions prevailing in these typical circuits by way of the two neighbouring discs 60, 61.

It can be seen that the hollow copper section exhibits an approximately square cross-section so that the close sideby-side arrangement of the windings 1, 2, 3 ... 15, 16, 17 of the flat spiral of the disc 60 leads to a closed, continuous structure of this disc 60. The same applies analogously to the neighbouring disc 61 and its windings 18, 19, 20 ... 31, 32, 33, 34.

The cooling agent arriving from the cooling agent supply 163 through the stub line 631 flows through the windings 1 ... 17 of the disc 60 and then through the windings 18 ... 34 of the disc 61, and returns thereafter to the cooling-agent outlet 164 via the stub line 641.

Magnet systems 50 of the described type are operated at a rated power in the range of some 10 kW in order to generate magnetic fields of high homogeneity and of a strength of up to several Tesla in volumes with dimensions in the range of several decimeters.

The rated currents required for this purpose, which must be supplied to the coils 51 to 54 by the power supply unit 72, lead to a considerable temperature rise in such coils. The heat so generated is carried off by the cooling agent flowing through the coils 51 to 54 along the path shown by way of example in FIG. 4.

Now, it will be easily realized that when entering the first winding 1, the cooling agent has a relatively low temperature which rises as the cooling agent flows through the windings 1 ... 34, until the cooling agent is finally discharged through the stub line 641.

Figure 5:
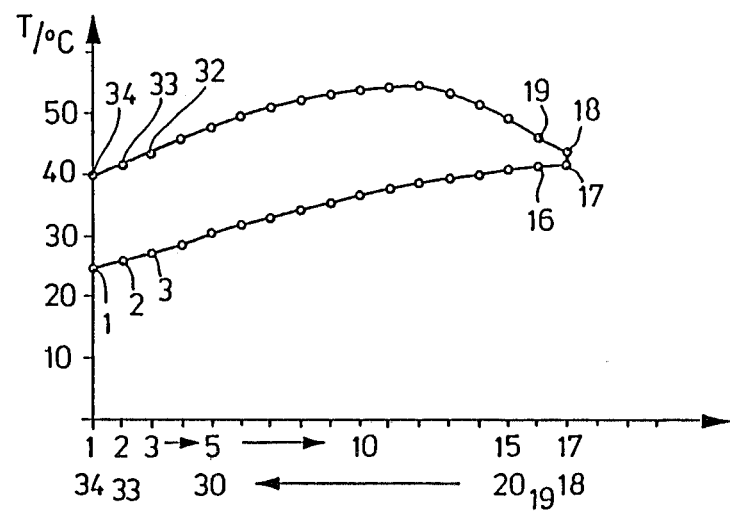
FIG. 5 is a diagram illustrating the temperature gradient along a path taken by the cooling agent, as shown in FIG. 4.

FIG. 5 shows the temperature curve as it develops across the individual windings 1 ... 34.

In FIG. 5 it can be seen that, starting from the initial winding 1, the temperature rises initially slowly from an initial value of, for example, 25° C. to the last winding 17 of the disc 60 where the final temperature reaches, for example, 42° C. On its further way through the windings 18 and the following windings, the temperature of the cooling agent then rises to a value considerably above 50° C. since the cooling agent is now guided past windings 14, 15, 16 of the disc 60 that have been heated already to a relatively high temperature. Thereafter, the cooling agent then flows through windings of the disc 61 arranged adjacent the colder windings of the disc 60 so that the temperature of the cooling agent drops again considerably to a value of approximately 40° C. In the given example, the cooling water has an inlet temperature of 20° C. and an outlet temperature of 25° C. The temperature profile encountered within the coil is that described before and can be explained by accumulation of heat and re-cooling effects between the discs 60 and 61.

It should be noted expressly that the number of 17 windings per disc mentioned before, and also the stated temperature values, are to be understood only as an example for illustration purposes and are not meant to restrict the invention in any way.

If one regards the temperature curve along the windings 1 ... 34 in FIG. 5, which represents the continuous operating condition at rated duty of the magnet system 50, one readily realizes that each winding 1 ... 34 is heated up to a specific temperature which translates itself into a specific mechanical expansion of the windings 1 ... 34 due to the fact that the material of the hollow copper section always exhibits a finite thermal expansion coefficient.

Accordingly, the temperature profile represented by FIG. 5 translates itself into a corresponding thermal expansion profile of all coils 51 to 54 which remains constant once the rated conditions have been reached and which, therefore, leads to a corresponding rated field distribution within the sample area of the magnet system 50.

Now, when the power supply unit 52 is switched off completely at the end of the working day, the windings 1 ... 34 cool down gradually to ambient temperature until all of them finally assume, in the course of the night, the same temperature value of, say, 20° C.

When the magnet system 50 is started up again at the beginning of the next working day, by switching on the power supply unit 52, the windings 1 ... 34 are heated up gradually, but it will take several hours until the final conditions of the temperature profile shown in FIG. 5 are re-established.

Now, it is of course possible to approximate the temperature profile of FIG. 5 by heating the magnet system 50 uniformly in order to keep it at a common mean temperature of, for example, 40°, instead of switching it off completely at the end of the working day. This can be achieved, for example, by switching off the flow of cooling agent completely and supplying the coils 51 to 54 with a reduced rest current just sufficient to heat the coils 51 to 54 up to the desired temperature value. This solution is, however, not acceptable for high-precision measurements because when the rest current is raised again to the rated current at the beginning of the next working day, and the cooling agent circuit is switched on simultaneously, the defined temperature profile illustrated in FIG. 5 has to be re-established, starting out from the mean temperature of, for example, 40° of all windings 1 ... 34. Although this process does not take as long as it would take to heat up the entire magnet system 50 to the defined temperature profile starting from ambient temperature, the waiting time required until stable conditions are obtained is still relatively long.

Consequently, the timing unit 73 is connected to both, the power supply unit 52 and the cooling-agent pump 65 and/or the heat exchanger 66 in order to reduce the operating condition of both units in a predetermined manner.

Figure 6:
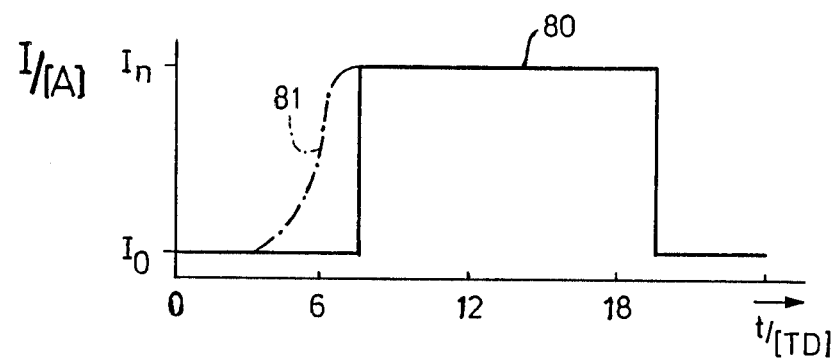
FIGS. 6 and 7 show diagrams illustrating the curve as a function of time of an energizing current and an active cooling-agent throughput in a magnet system according to the invention.
Figure 7:
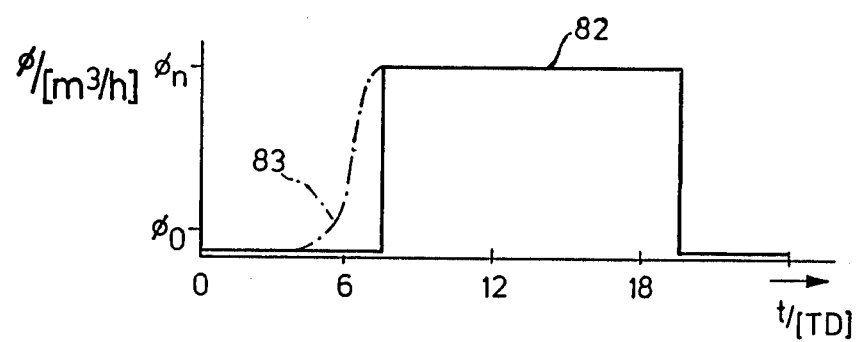

Corresponding examples are represented in FIGS. 6 and 7 where FIG. 6 illustrates the development as a function of time of the current I over the time of the day while FIG. 7 illustrates the development as a function of time of the active throughput $\phi$ over the time t.

Curve 80 represents the development of the energizing current I. It can be seen that up to, for example, 8.00 a.m., the system is set to a rest current $I_O$, which is then increased, at 8.00 a.m., to the rated value $I_n$. At the end of the working day, for example at 7.00 p.m., the energizing current I is reduced again to the rest current $I_O$.

The same applies analogously to the curve 82 in FIG. 7 representing the active throughput $\phi$ which is increased, at the stated points in time, from a rest throughput $\phi_O$ to the rated throughput $\phi_n$ and then reduced again, at the end of the working day, to the rest value $\phi_O$.

The curves 81 and 83 in FIGS. 6 and 7 indicate in addition that it is not necessary to increase the operating values at the beginning of the working day suddenly, but that instead they can be increased to the rated values $I_n$ and $\phi_n$ continuously or by steps. This can be achieved, for example, by programming the timing clock 73 in a suitable manner so that the operating values commence to rise already at an early time in the morning, for example at 4.00 a.m.

For the purposes of FIG. 6 it has been assumed that $I_O$ is approximately 1/7 of the operating current $I_n$. Since, as is generally known, the power at an approximately constant active resistance develops as the square of the current, this means that the ratio of $\phi_O/\phi_n$ in FIG. 7 is approximately equal to 1/49. It is, therefore, possible to reduce the power in the rest condition considerably without changing the shape of the temperature profile of FIG. 5 in any manner. In order to ensure that the temperature profile will remain substantially unchanged in the inoperative condition it is, however, necessary that the power be higher in the inoperative condition than the losses resulting from thermal radiation and thermal transmission.

Curve 82 in FIG. 7 illustrates by way of example that the active throughput $\phi$ can be reduced to very low values so that almost the entire electric energy applied is utilized for maintaining the temperature profile according to FIG. 5 and the remaining low active throughput of cooling agent has the only effect to ensure that the shape of the temperature profile according to FIG. 5 remains unchanged.

Whenever the above explanations refer to the active coolingagent throughput, it is clear to the man skilled in the art that this term may relate to both the temperature of the cooling agent and its flow rate per unit of time. It is further understood that the active throughput of cooling agent can be influenced either by adjusting the speed of the cooling agent pump 65, or by actuating an adjusting valve—not shown in FIG. 1—arranged in the cooling-agent pressure line. In addition, it is also possible to act upon the heat exchanger 66 in a suitable manner, in particular for reducing the temperature of the cooling agent, for example by varying the blower speed of an air cooler, or in a similar manner.

Finally, it is also understood that although the described embodiment comprising flat spirals wound from hollow copper sections is particularly preferred, the invention is by no means limited to this solution. Rather, the invention can be used generally in connection with all electromagnets comprising cooling bodies. The coils may, for example, exhibit a rectangular or banana-shaped form, viewed in the axial direction. And the lines may be wound in the form of the described double spirals, or in the form of the known single spirals, or else in double-helical form, as described for example on page 56 of the before-mentioned book by Montgomery.

The same applies to different designs of the magnets, where individual layers of solid copper wires may alternate with layers of cooling bodies or wound hollow copper sections, and also to coils of electromagnets which are provided with flat cooling bodies only on their sides.

We claim:

1. Method of operating a magnet system, in particular the magnet system of a nuclear spin tomograph producing a magnetic field of high homogeneity, which magnet system comprises at least one coil made from an electrically conductive material of finite resistivity and a cooling device arranged in thermal contact with the coil, the method comprising the steps of passing a rated current through said coil which produces a magnetic field of predetermined strength and passing a cooling agent through said cooling device, the throughput of the cooling agent being adjusted in such a manner that a specific temperature profile is obtained within the coil, characterized in that during breaks, in particular at night, when the magnetic field of predetermined strength is not required, the intensity of the current flowing through the coil is reduced to a predetermined rest current ($I_O$) and the throughput of cooling agent is simultaneously adjusted to a likewise predetermined rest value ($\phi_n$) at which the specific temperature profile remains substantially unchanged.

2. Method according to claim 1, characterized in that the transition from the nest values ($I_O$, $\phi_O$) to the rated values ($I_n$, $\phi_n$) is adjusted to develop along a steadily rising curve.

3. Method according to claim 2, characterized in that the transition from the rest values ($I_O$, $\phi_O$) to the rated values ($I_n$, $\phi_n$) is adjusted to develop along a stepped curve.

4. Method according to claim 1, characterized in that the cooling agent is guided through pipes of an electrically conductive material exhibiting a finite resistivity and that the at least one coil is wound from the said pipes.

5. Method according to claim 4, characterized in that said pipes are wound to form flat spirals, that several such flat spirals ane arranged in the form of discs one beside the other to form the coils, and that the cooling agent is guided from one end of a flat coil to its opposite end and from there to the corresponding end of the neighbouring flat spiral and then to the latter's other end, several such pains of flat coils being arranged in parallel between a common cooling-agent supply line and a common cooling-agent outlet.

6. Device for operating a magnet system, in particular the magnet system of a nuclear spin tomograph with high homogeneity of the magnetic field, the said device comprising a power supply unit supplying at least one coil, which is made from an electrically conductive material having a finite resistivity, with a rated current generating a magnet of predetermined strength, and a cooling-agent supply unit feeding cooling agent to a cooling device which is in thermal contact with the said coil, the throughput of said cooling-agent being adjusted in such a manner that a specific temperature profile is obtained within said coil, characterized in that the said power supply unit and the said cooling-agent supply unit are actively connected to a timing unit whose control signals act to change the output current (I) of the said power supply unit and the active throughput ($\phi$) of the said cooling-agent supply unit during operating breaks, in particular over night, when the magnetic field of predetermined strength is not required, in such a manner that the intensity of the current flowing through the said coil is reduced to a predetermined rest current value ($I_O$) and the throughput of the said cooling agent is simultaneously reduced to a predetermined rest value ($\phi_n$) at which the specific temperature profile remains substantially unchanged.

7. Device according to claim 6, characterized in that the said timing unit is connected to a cooling-agent pump.

8. Device according to claim 6, chaeacteeized in that the said timing unit is connected to an adjusting valve arranged in a cooling-agent pressure line.

9. Device according to claim 6, characterized in that the said timing unit is connected to a heat exchanger for adjusting the cooling-agent temperature at the outlet of the said heat exchanger.

10. Device according to claim 6, characterized in that in the first operating mode the said timing unit connects the magnet system to a power supply unit and a coolingagent supply unit of high performance (rated power), while in the second operating mode it connects the magnet system to units of lower performance (rest power).

* * * * *